(12) United States Patent
Stephani et al.

(10) Patent No.: US 8,610,461 B2
(45) Date of Patent: Dec. 17, 2013

(54) SPLIT DECODE LATCH WITH SHARED FEEDBACK

(75) Inventors: Richard J. Stephani, St. Paul, MN (US); Amy R. Rittenhouse, Richfield, MN (US); Donald A. Evans, Carroll, OH (US)

(73) Assignee: LSI Corporation, San Jose, CA (US)

( * ) Notice: Subject to any disclaimer, the term of this patent is extended or adjusted under 35 U.S.C. 154(b) by 104 days.

(21) Appl. No.: 13/247,361

(22) Filed: Sep. 28, 2011

(65) Prior Publication Data

US 2013/0076393 A1 Mar. 28, 2013

(51) Int. Cl.
*H03K 19/02* (2006.01)

(52) U.S. Cl.
USPC ............... 326/56; 326/58; 326/97; 326/98; 326/106; 327/146

(58) Field of Classification Search
USPC .......... 326/56–58, 93–98, 105–106; 327/141, 327/144, 146
See application file for complete search history.

(56) References Cited

U.S. PATENT DOCUMENTS

| | | | |
|---|---|---|---|
| 5,719,913 A | 2/1998 | Maeno | 377/54 |
| 5,796,283 A * | 8/1998 | Martin | 327/218 |
| 6,621,302 B2 * | 9/2003 | Lowy et al. | 326/93 |
| 6,970,025 B2 * | 11/2005 | Magoon et al. | 327/115 |
| 7,128,082 B1 | 10/2006 | Cerretelli et al. | 137/14 |
| 2002/0017937 A1 * | 2/2002 | Schoellkopf | 327/185 |
| 2007/0086263 A1 * | 4/2007 | Fenstermaker | 365/230.06 |
| 2007/0162802 A1 | 7/2007 | Miwa | 714/726 |
| 2008/0258789 A1 | 10/2008 | Motomura | 327/202 |
| 2009/0108885 A1 * | 4/2009 | Natonio et al. | 327/115 |
| 2009/0115468 A1 * | 5/2009 | Berthold et al. | 327/141 |
| 2009/0121764 A1 | 5/2009 | Uemura et al. | 327/203 |
| 2011/0095800 A1 | 4/2011 | Ramaraju et al. | 327/211 |

* cited by examiner

*Primary Examiner* — Jason M Crawford
(74) *Attorney, Agent, or Firm* — Christopher P. Maiorana, PC

(57) ABSTRACT

An apparatus having a first circuit and a second circuit. The first circuit may be configured to generate an output signal in response to (i) an intermediate signal, and (ii) a clock signal. The second circuit may be configured to generate the intermediate signal and a digital complement of the output signal in response to (i) an input signal and (ii) the clock signal. The intermediate signal may form a feedback to ensure the output signal and the digital complement of the output signal are in complementary states during a power up.

20 Claims, 6 Drawing Sheets

US 8,610,461 B2

SPLIT DECODE LATCH WITH SHARED FEEDBACK

FIELD OF THE INVENTION

The present invention relates to digital circuits generally and, more particularly, to a method and/or apparatus for implementing a split decode latch with shared feedback.

BACKGROUND OF THE INVENTION

A conventional 2-to-4 address decode scheme can have two inputs IN0 and IN1 sent to two latches to produce latched outputs. The latched outputs can be inputs to NAND gates to produce 1 active output out of the 4 outputs. For performance, it is important to reduce the delay through the latches. This can be done by reducing the number of logic stages needed to produce the latched outputs.

It would be desirable to implement a split decode latch with shared feedback.

SUMMARY OF THE INVENTION

The present invention concerns an apparatus comprising a first circuit and a second circuit. The first circuit may be configured to generate an output signal in response to (i) an intermediate signal, and (ii) a clock signal. The second circuit may be configured to generate the intermediate signal and a digital complement of the output signal in response to (i) an input signal and (ii) the clock signal. The intermediate signal may form a feedback to ensure the output signal and the digital complement of the output signal are in complementary states during a power up.

The objects, features and advantages of the present invention include providing a split decode latch that may (i) have a shared feedback, (ii) reduce propagation delay, (iii) operate on a single clock cycle and/or (iv) be implemented as part of a 2-to-4 decoder.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
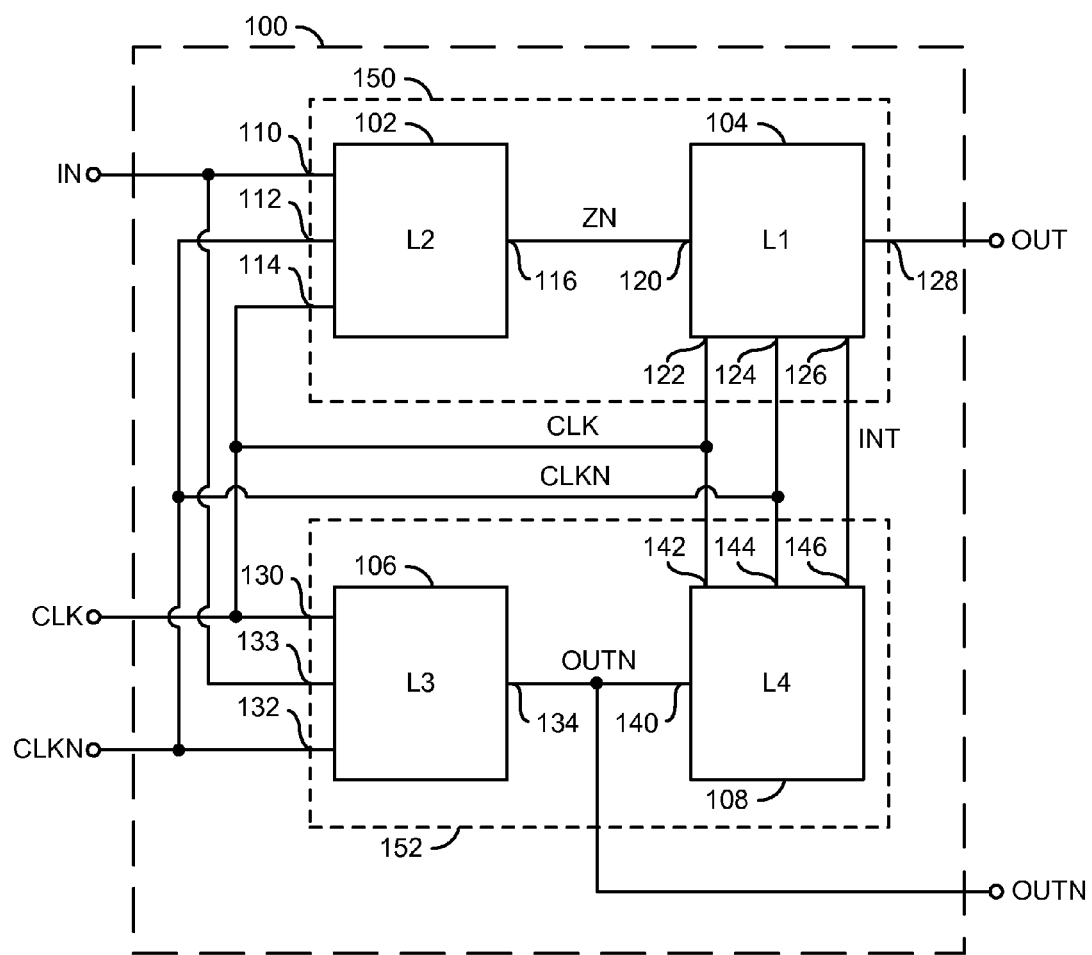
FIG. 1 is a block diagram of an embodiment of the invention.

Referring to FIG. 1, a block diagram of a circuit 100 is shown in accordance with an embodiment of the present invention. The circuit (or device or apparatus or integrated circuit) 100 generally comprises a block (or circuit) 102, a block (or circuit) 104, a block (or circuit) 106 and a block (or circuit) 108. The circuit 102 may be implemented as part of a latch, such as a split decode latch. The circuit 104 may be implemented as another part of a latch. The circuit 106 may be implemented as part of a latch. The circuit 108 may be implemented as another part of a latch.

The circuit 102 may have an input 110 that may receive a signal (e.g., IN), an input 112 that may receive a signal (e.g., CLKN), an input 114 that may receive a signal (e.g., CLK), and an output 116 that may present a signal (e.g., ZN). The circuit 104 may have an input 120 that may receive the signal ZN, an input 122 that may receive the signal CLK, an input 124 that may receive the signal CLKN, an input 126 that may receive a signal (e.g., INT) and an output 128 that may present a signal (e.g., OUT).

The circuit 106 may have an input 130 that may receive the signal CLK, an input 132 that may receive the signal CLKN, an input 133 that may receive the signal IN and an output 134 that may present a signal OUTN. The circuit 108 may have an input 140 that may receive the signal OUTN, an input 142 that may receive the signal CLK, an input 144 that may receive the signal CLKN and an output 146 that may present the signal INT. The signal IN may be an input signal that, in one example, may represent a data signal. The signal OUT may be an output signal that may be latched by the clock signal CLK. The signal CLK may be a clock signal that oscillates at a predetermined frequency. The signal CLKN may be a digital complement of the signal CLK. The signal ZN may be an intermediate signal (or node). The signal INT may be an intermediate signal.

The circuit 102 and the circuit 104 may form a first portion 150. The circuit 106 and the circuit 108 may form a second portion 152. Each of the devices in the first portion 150 (to be described in connection with FIG. 2) operate during a single clock cycle. Each of the components in the second portion 152 (to be described in more detail in connection with FIG. 2) operate during a single clock cycle.

Figure 2:
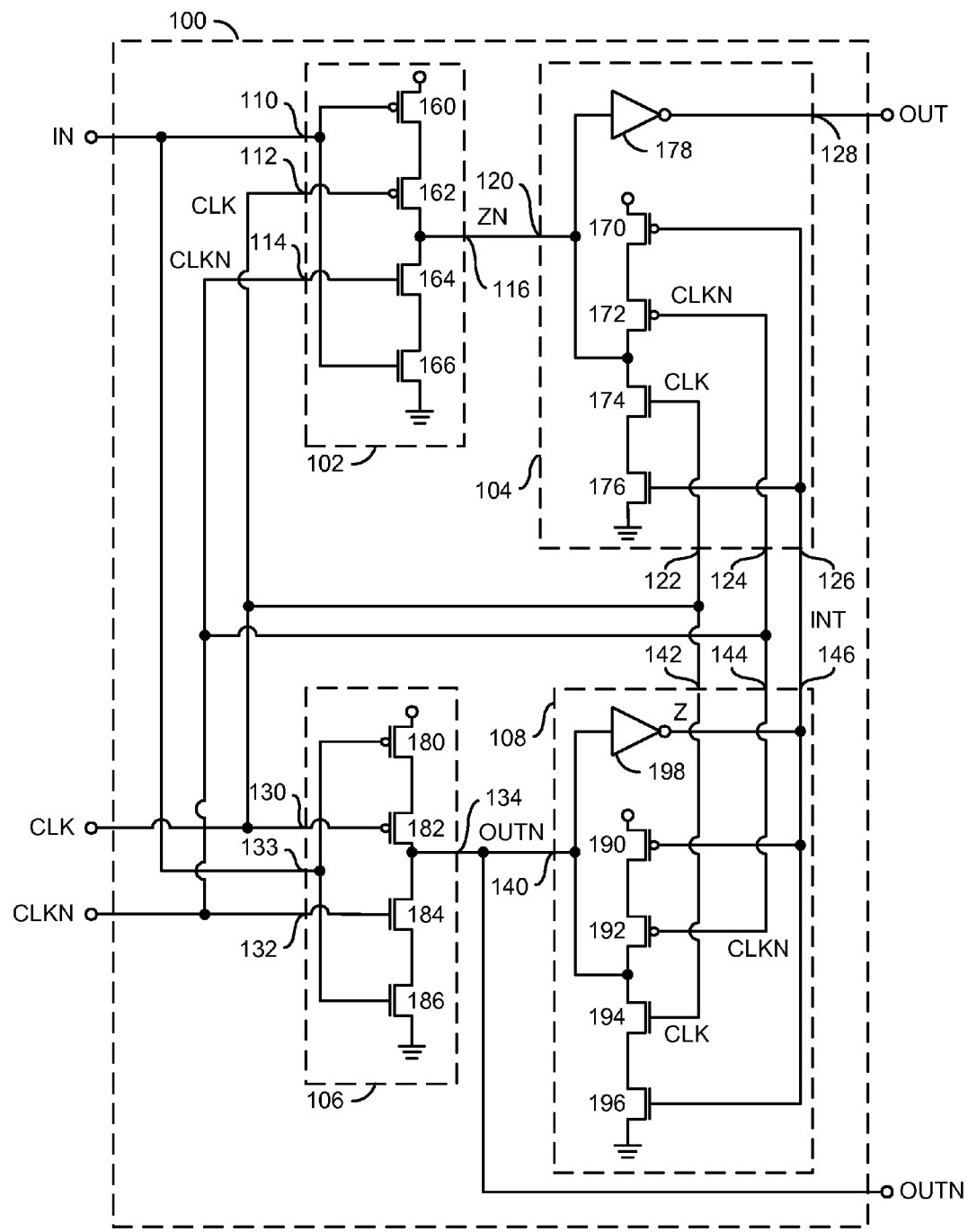
FIG. 2 is a more detailed diagram of the embodiment of FIG. 1.

Referring to FIG. 2, a more detailed diagram of the circuit 100 is shown. The circuit 102 generally comprises a transistor 160, a transistor 162, a transistor 164 and a transistor 166. The circuit 104 generally comprises a transistor 170, a transistor 172, a transistor 174, a transistor 176 and an inverter 178. The circuit 106 generally comprises a transistor 180, a transistor 182, a transistor 184 and a transistor 186. The circuit 108 generally comprises a transistor 190, a transistor 192, a transistor 194, a transistor 196 and an inverter 198. The transistors 160 and 162 may be implemented as a P-channel transistors. The transistors 164 and 166 may be implemented as an N-channel transistors. Similarly, the transistors 170 and 172, the transistors 180 and 182 and the transistors 190 and 192 may be implemented as P-channel transistors. The transistors 174 and 176, the transistors 184 and 186 and the transistors 194 and 196 may be implemented as N-channel transistors. However, the particular implementation of the various transistors may be varied (e.g., inverted, etc.) to meet the design criteria of a particular implementation.

The transistors 160, 162, 164 and 166 may form a tri-state inverter. While the circuit 100 (or the circuit 102 or the signals CLK and CLKN) are in a transparent state (or mode), the transistors 160-166 may generate the signal ZN by inverting the signal IN. While the circuit 100 (or the circuit 102 or the signals CLK and CLKN) are in a holding state (or mode), the transistors 162 and 164 may be in a high impedance condition and thus allows the signal ZN to be driven by the circuit 104.

The transistors 170, 172, 174 and 176 may form a tri-state inverter. While the circuit 100 (or the circuit 104 or the signals CLK and CLKN) are in the holding state, the transistors 170-176 may generate the signal ZN by inverting the signal INT. While the circuit 100 (or the circuit 104 or the signals CLK and CLKN) are in the transparent state, the transistors 172 and 174 may be in a high impedance condition and thus allows the signal ZN to be driven by the circuit 102.

The transistors 180, 182, 184 and 186 may form a tri-state inverter. While the circuit 100 (or the circuit 106 or the signals CLK and CLKN) are in the transparent state, the transistors 180-186 may generate the signal OUTN by inverting the signal IN. While the circuit 100 (or the circuit 106 or the signals CLK and CLKN) are in the holding state, the transistors 182 and 184 may be in a high impedance condition and thus allows the signal OUTN to be driven by the circuit 108.

The transistors 190, 192, 194 and 196 may form a tri-state inverter. While the circuit 100 (or the circuit 108 or the signals CLK and CLKN) are in the holding state, the transistors 190-196 may generate the signal OUTN by inverting the signal INT (or Z). While the circuit 100 (or the circuit 108 or the signals CLK and CLKN) are in the transparent state, the transistors 192 and 194 may be in a high impedance condition and thus allows the signal OUTN to be driven by the circuit 106.

The circuit 100 may split a single latch into parallel latch nodes to produce the latched signal OUT and the inverse latched signal OUTN. When the circuit 100 is used in a 2-to-4 decoder, the performance of the circuit is significantly improved when compared to existing approaches. Even when the device sizes of an existing latch are increased more than 2× that of the split latch, the split latch performance is generally better. A shared feedback (e.g., the signal Z or INT) between the two parts of the circuit 100 may insure that the value presented in the signal OUT is consistently the opposite of the value presented in the signal OUTN when the circuit 100 is powered up.

In general, when the signal CLK has a logical "0" (or a logical low) value and the signal CLKN has a logical "1" (or a logical high) value, the latch is in the transparent state and the signal ZN is driven to ~IN (an inverse of the value of the signal IN), the signal OUTN is driven to ~IN, the signal OUT is driven to IN, and the signal Z is driven to IN. The longer of the two paths (e.g., the path from the signal IN to the signal OUT may be longer than the path from the signal IN to the signal OUTN) does not have the output capacitive load on the signal ZN. In an existing latch, the signal ZN would drive the load coupled to the signal OUTN (e.g., ZN=OUTN). The smaller (or lower) capacitive load on the signal ZN generally give a performance advantage to some embodiments of the invention. The advantage may be a shortened delay between a start of a transition in the signal OUTN (see FIG. 4) until a start of a transition in the signal OUT due to the lower capacitive loading on the signal ZN.

Some embodiments of the invention may use a shared feedback (e.g., the signal INT) so that when the latch circuit 104 is in the holding state, the signal OUT may be driven to the value stored in the cross-couple latch circuit 108. Therefore, the signal OUT may always be ~OUTN when the latch circuit 108 stores a value. Maintaining complementary values on the signals OUT and OUTN may also be beneficial during a power-up when the signal OUT=~OUTN condition may be specified to be true.

Figure 3:
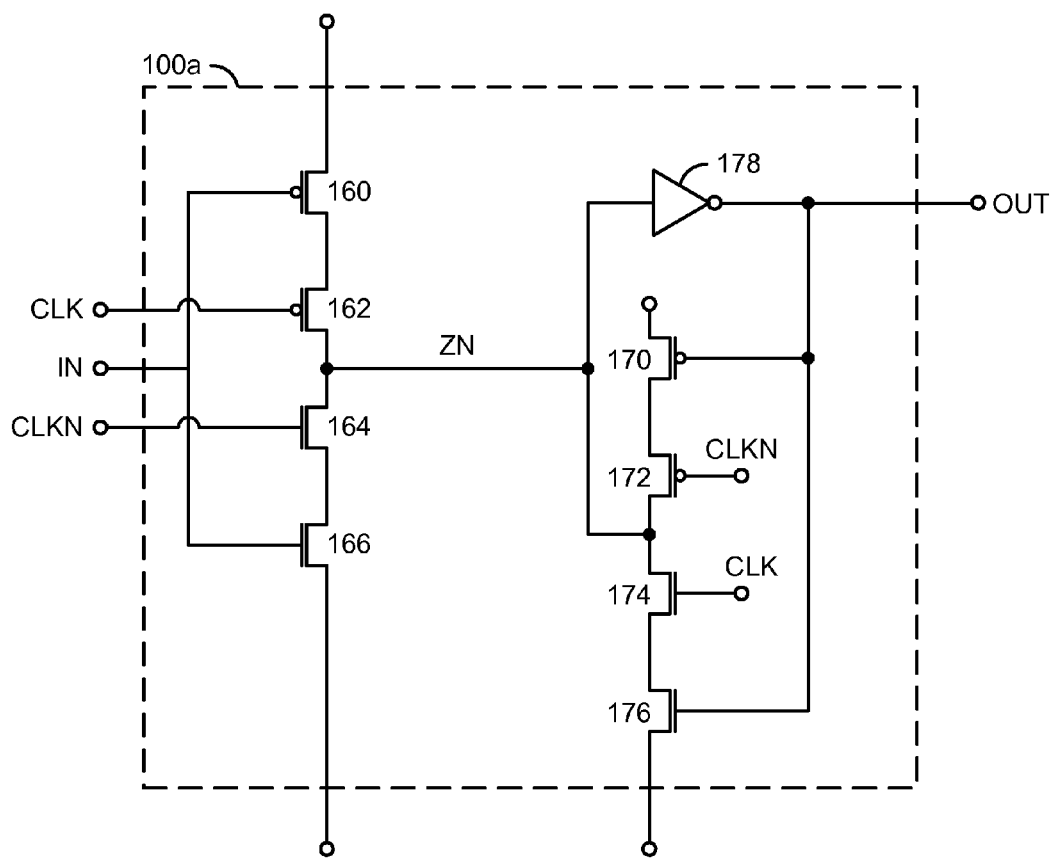
FIG. 3 is a detailed diagram of a latch.

Referring to FIG. 3, a detailed diagram of a circuit 100a is shown. The circuit 100a may be a variation of the circuit 100. In situations were the power-up complementary condition is unspecified or a don't care situation, the transistors 170 and 176 may be driven directly from the inverter 178 through the signal OUT. The circuit 100a generally maintains the performance advantage of the circuit 100 in that the signal ZN drives a small (or minimal) capacitive load and thus the transitions of the signal OUT relative to the signal OUTN may have a minimal delay.

Figure 4:
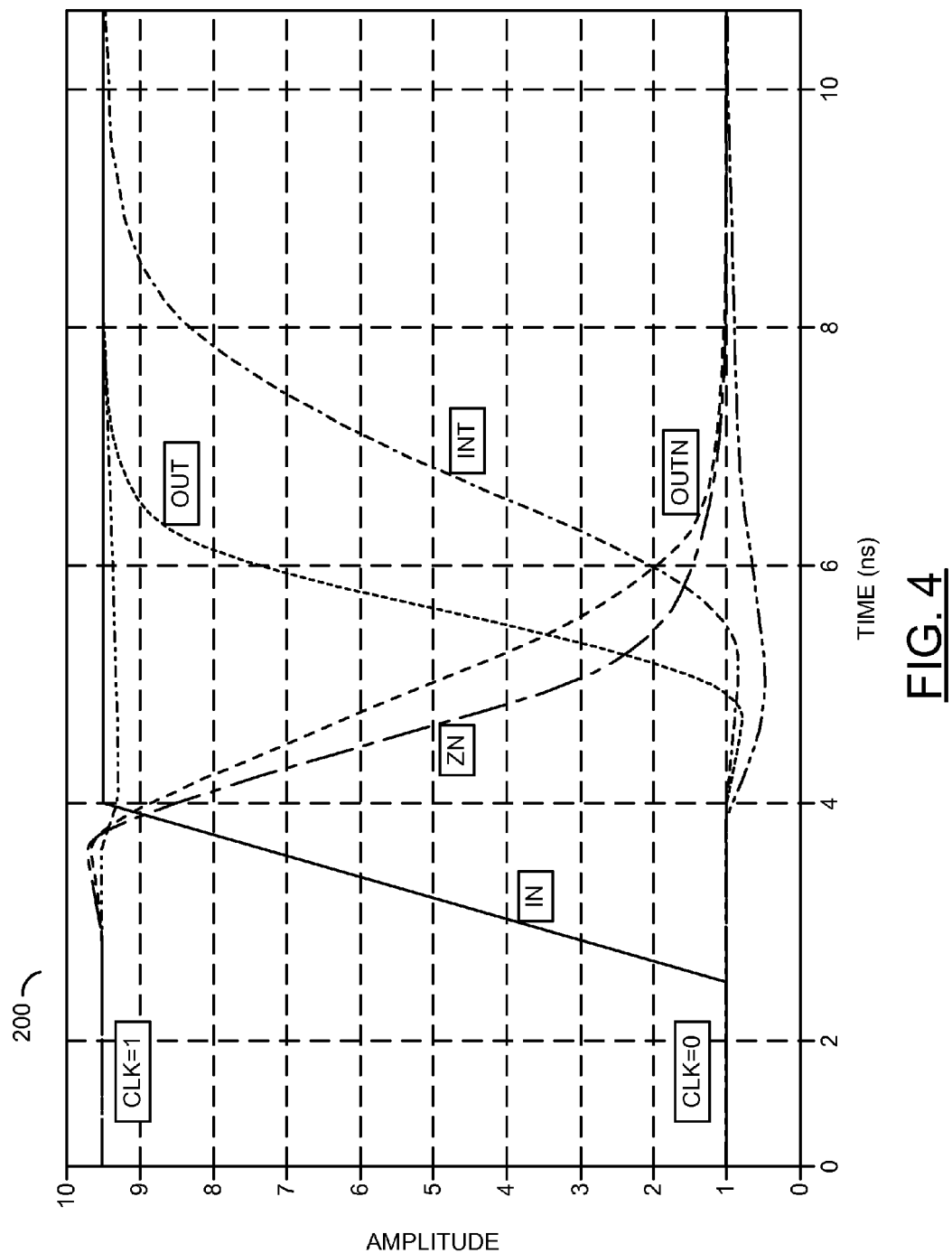
FIG. 4 is a diagram of waveforms while in a transparent state.

Referring to FIG. 4, a diagram of waveforms 200 for several signals while in the transparent state is shown. When the signal IN transitions from "0" to "1", the circuit 102 may transition the signal ZN from "1" to "0" and the circuit 106 may transition the signal OUTN from "1" to "0". The signal OUTN generally transitions slower than the signal ZN due to the higher capacitive load on the signal OUTN compared to the signal ZN. The transition of the signal ZN generally causes the circuit 104 to transition the signal OUT from "0" to "1". The transition of the signal OUTN generally causes the circuit 108 to transition the signal INT from "0" to "1". While in the holding state, the signal INT generally maintains the signals OUT and OUTN at opposite logical values.

Figure 5:
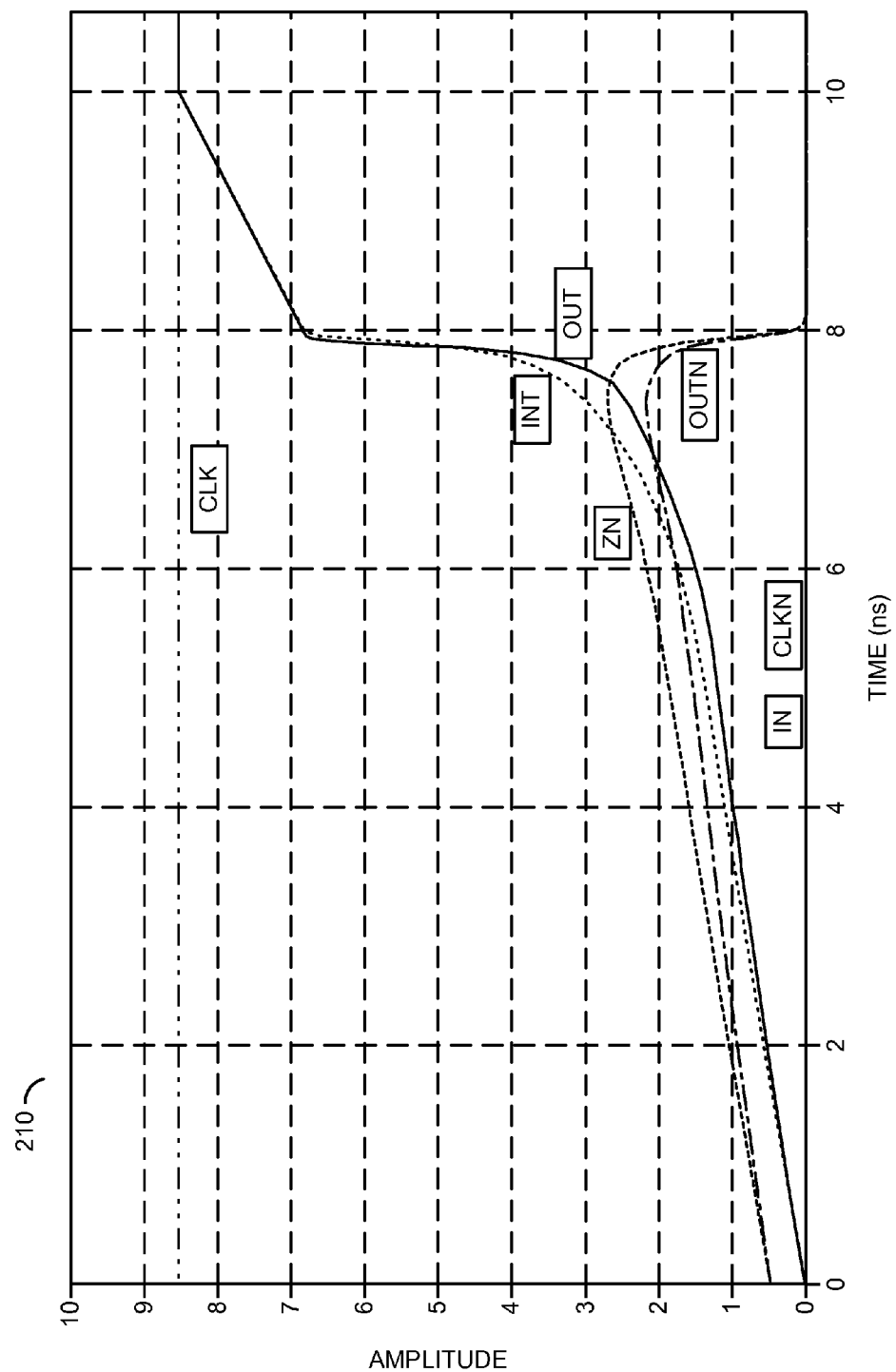
FIG. 5 is a diagram of waveforms while in power-up.

Referring to FIG. 5, a diagram of waveforms 210 for several signals while in power-up is shown. The waveforms 210 generally illustrate the signals ZN, INT, OUT and OUTN during the power-up. Due to the cross-coupling provided by the signal INT, the signal OUT may maintain a complementary value to the signal OUTN once the signal INT has reached an asserted amplitude (e.g., a minimal logical "1" value).

Figure 6:
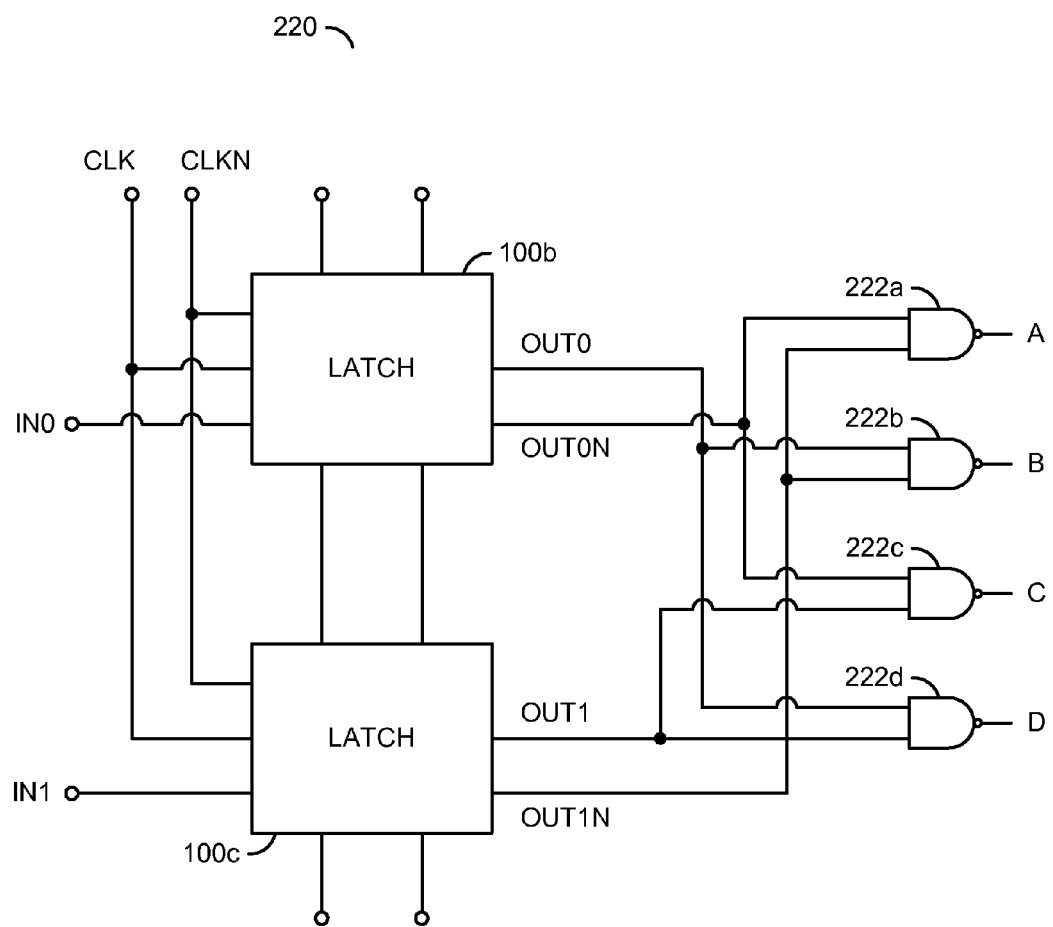
FIG. 6 is a diagram of a 2-to-4 decoder.

Referring to FIG. 6, a diagram of an example implementation of a 2-to-4 decoder 220 is shown. The decoder 220 generally comprises a copy of the circuit 100 (e.g., circuit 100b), another copy of the circuit 100 (e.g., circuit 100c) and multiple blocks (or circuits) 222a-222d. Each circuit 222a-222d may be implemented as a two-input logical NAND gate.

The circuit 100b may receive a signal (e.g., IN0) and generate complementary signals (e.g., OUT0 and OUT0N). The signal IN0 may be representative of the signal IN of FIG. 2. The signals OUT0 and OUT0N may be representative of the signals OUT and OUTN in FIG. 2. The circuit 100c may receive a signal (e.g., IN1) and generate complementary signals (e.g., OUT1 and OUT1N). The signal IN1 may be representative of the signal IN of FIG. 2. The signals OUT1 and OUT1N may be representative of the signals OUT and OUTN in FIG. 2. The signal OUT0 may be received by the circuits 222b and 222d. The signal OUT0N may be received by the circuits 222a and 222c. The circuits 222c and 222d may receive the signal OUT1. The signal OUT1N may be received by the circuits 222a and 222b. Each circuit 222a-222d may generate a respective signal (e.g., A-D). Each circuit 100b and 100c may receive the signals CLK and CLKN.

While the circuits 100b and 100c are in the transparent state, the signals OUT0 and OUT1 may follow the signals IN0 and IN1 respectively. While the circuits 100b and 100c are in the holding state, the signals OUT0 and OUT1 may convey the latched values. While in the holding state, the signals OUT0 and OUT1 may be generated independently of the signals IN0 and IN1.

The circuits 222a-222d may be wired to the circuits 100b and 100c to implement a 2-to-4 decode operation. The 2-to-4 decode operation generally provides that a single signal among the signals A-D may be logically low (e.g., "0") at any given time and the remainder of the signals A-D may be logically high (e.g., "1"). The 2-to-4 decode operation may be illustrated by Table 1 as follows:

TABLE 1

| IN1 | IN0 | A | B | C | D |
|---|---|---|---|---|---|
| 0 | 0 | 0 | 1 | 1 | 1 |
| 0 | 1 | 1 | 0 | 1 | 1 |
| 1 | 0 | 1 | 1 | 0 | 1 |
| 1 | 1 | 1 | 1 | 1 | 0 |

It will be apparent to those skilled in the relevant art(s) that certain nodes of transistors and other semiconductor devices may be interchanged and still achieve some desired electrical characteristics. The node interchanging may be achieved physically and/or electrically. Examples of transistor nodes that may be interchanged include, but are not limited to, the emitter and collector of bipolar transistors, the drain and source of field effect transistors, and the first base and second base of unijunction transistors.

The functions performed by the diagrams of FIGS. 1-3 and 6 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to generate an output signal in response to (i) an intermediate signal and (ii) a clock signal; and
   a second circuit configured to generate said intermediate signal and a digital complement of said output signal in response to (i) an input signal and (ii) said clock signal, wherein (A) said intermediate signal forms a feedback to ensure said output signal and said digital complement of said output signal are in complementary states for each transition of said clock signal during a power up, and (B) said second circuit updates said intermediate signal on each transition of said clock signal.

2. The apparatus according to claim 1, wherein said first circuit and said second circuit each operate on a single cycle of said clock signal.

3. The apparatus according to claim 1, wherein said first circuit generates said output signal in further response to said digital complement of said clock signal.

4. The apparatus according to claim 3, wherein said second circuit generates said intermediate signal in further response to said digital complement of said clock signal.

5. The apparatus according to claim 1, wherein said apparatus forms a latch.

6. The apparatus according to claim 1, wherein said apparatus is implemented as part of a 2-to-4 decoder.

7. The apparatus according to claim 1, wherein said first circuit is further configured to (i) transfer said input signal to said output signal while said clock signal is in a transparent state and (ii) hold said output signal while said clock signal is in a holding state.

8. The apparatus according to claim 1, wherein said first circuit comprises (i) a third circuit configured to generate said output signal in response to said digital complement of said input signal and said clock signal and (ii) a fourth circuit configured to generate said digital complement of said input signal in response to said input signal and said clock signal.

9. The apparatus according to claim 1, wherein said second circuit comprises (i) a third circuit configured to generate said digital complement of said output signal in response to said input signal and said clock signal and (ii) a fourth circuit configured to generate said intermediate signal in response to said digital complement of said output signal and said clock signal.

10. The apparatus according to claim 1, wherein said apparatus is implemented as one or more integrated circuits.

11. The apparatus according to claim 1, wherein said first circuit comprises an inverter configured to generate said output signal in response to said intermediate signal.

12. The apparatus according to claim 1, wherein said first circuit further comprises a tri-state inverter configured to generate said intermediate signal while said apparatus is in a holding state.

13. An apparatus comprising:
a first circuit configured to generate an output signal in response to (i) a first intermediate signal, (ii) a second intermediate signal, (iii) a first clock signal and (iv) a second clock signal;
a second circuit configured to generate said first intermediate signal in response to (i) an input signal, (ii) said first clock signal and (iii) said second clock signal;
a third circuit configured to generate a complement of said output signal in response to (i) said first clock signal, (ii) said second clock signal and (iii) said input signal; and
a fourth circuit configured to generate said second intermediate signal in response to said complement of said output signal, (ii) said first clock signal and (iii) said second clock signal, wherein said first circuit comprises (a) an inverter configured to generate said output signal in response to said first intermediate signal and (b) a tri-state inverter configured to generate said first intermediate signal in response to said second intermediate signal while said apparatus is in a holding state.

14. The apparatus according to claim 13, wherein said second intermediate signal forms a feedback to ensure said output signal and said complement of said output signal are in complementary states during a power up.

15. The apparatus according to claim 13, wherein said second circuit generates said first intermediate signal while said apparatus is in a transparent state.

16. The apparatus according to claim 13, wherein said inverter is configured to generate said second intermediate signal in response to said complement of said output signal.

17. The apparatus according to claim 16, wherein said tri-state inverter is configured to generate said complement of said output signal while said apparatus is in said holding state.

18. The apparatus according to claim 17, wherein said third circuit generates said complement of said output signal while said apparatus is in a transparent state.

19. The apparatus according to claim 13, wherein said apparatus is implemented as one or more integrated circuits.

20. An apparatus comprising:
a first circuit configured to generate an output signal in response to (i) an intermediate signal and (ii) a clock signal; and
a second circuit configured to generate said intermediate signal and a digital complement of said output signal in response to (i) an input signal and (ii) said clock signal, wherein (A) said intermediate signal forms a feedback to ensure said output signal and said digital complement of said output signal are in complementary states during a power up, and (B) said first circuit comprises (a) an inverter configured to generate said output signal in response to said intermediate signal and (b) a tri-state inverter configured to generate said intermediate signal while said apparatus is in a holding state.

* * * * *